US012334283B2

(12) United States Patent
Lecheler et al.

(10) Patent No.: US 12,334,283 B2
(45) Date of Patent: Jun. 17, 2025

(54) FAULT DETECTION IN SPRING-LOADED DRIVES OF MEDIUM-VOLTAGE SWITCHGEAR SYSTEMS

(71) Applicant: Siemens Aktiengesellschaft, Munich (DE)

(72) Inventors: Stefan Lecheler, Berlin (DE); Malte Georg Hirte, Petershagen (DE)

(73) Assignee: Siemens Aktiengesellschaft, Munich (DE)

( * ) Notice: Subject to any disclaimer, the term of this patent is extended or adjusted under 35 U.S.C. 154(b) by 161 days.

(21) Appl. No.: 18/006,192

(22) PCT Filed: Jun. 9, 2021

(86) PCT No.: PCT/EP2021/065379
§ 371 (c)(1),
(2) Date: Jan. 20, 2023

(87) PCT Pub. No.: WO2022/017675
PCT Pub. Date: Jan. 27, 2022

(65) Prior Publication Data
US 2023/0335350 A1    Oct. 19, 2023

(30) Foreign Application Priority Data
Jul. 20, 2020  (DE) .................... 10 2020 209 017.3

(51) Int. Cl.
*H01H 3/30*       (2006.01)
*G01R 31/327*     (2006.01)

(52) U.S. Cl.
CPC ....... *H01H 3/3052* (2013.01); *G01R 31/3275* (2013.01); *H01H 2300/052* (2013.01)

(58) Field of Classification Search
CPC .......... H01H 3/3052; H01H 2300/052; G01R 31/3275
See application file for complete search history.

(56) References Cited

U.S. PATENT DOCUMENTS

| 6,667,452 | B2 * | 12/2003 | Spiegel | H01H 3/30 |
| | | | | 200/501 |
| 10,411,619 | B2 * | 9/2019 | Li | H02P 29/50 |
| 11,164,704 | B2 | 11/2021 | Hilker | |
| 11,742,783 | B2 * | 8/2023 | Hilker | H02P 23/14 |
| | | | | 318/503 |
| 2017/0047181 | A1 | 2/2017 | Yang et al. | |

FOREIGN PATENT DOCUMENTS

| DE | 102011089039 A1 | 6/2013 |
| DE | 102016218334 A1 | 3/2018 |

* cited by examiner

*Primary Examiner* — Reena Aurora
(74) *Attorney, Agent, or Firm* — Laurence A. Greenberg; Werner H. Stemer; Ralph E. Locher

(57) ABSTRACT

A method of operating a spring-loaded drive of a medium-voltage switchgear system includes at least the following steps: measuring a drive current of an electric auxiliary drive for loading a drive spring of the spring-loaded drive of the medium-voltage switchgear system; loading the drive spring by the electric auxiliary drive; creating an evaluation data set in accordance with the measured drive current; comparing the evaluation data set with an expectation; and outputting a maintenance signal in accordance with a result of the comparison. There is also described a spring-loaded drive and a medium-voltage switchgear system having a spring-loaded drive of this type.

13 Claims, 3 Drawing Sheets

FAULT DETECTION IN SPRING-LOADED DRIVES OF MEDIUM-VOLTAGE SWITCHGEAR SYSTEMS

FIELD AND BACKGROUND OF THE INVENTION

The invention relates to a method for operating a spring energy store drive of a medium-voltage switchgear installation, to a spring energy store drive configured to carry out the operating method according to the invention, and to a medium-voltage switchgear installation comprising such a spring energy store drive.

TECHNICAL BACKGROUND

Switching actions in medium-voltage switchgear installations such as, in particular, the opening of the switch by moving a moving contact of a switch of the medium-voltage switchgear installation away from its mating contact typically have to be performed within a period of a few milliseconds after arrival of a corresponding control signal in order to preclude endangerment of personnel and material to the greatest extent. Spring energy store drives are therefore used, which keep the energy required for the switching action of a switch in order to be able to react to a corresponding control signal with the least possible delay. Said spring energy store drives have one or more springs tensioned by way of an electric auxiliary drive. In this case, the tensioning of the spring(s) is usually effected without increasing requirements in respect of the tensioning speed. The electric auxiliary drive is usually connected to the spring via a gear mechanism or contains such a mechanism.

Faults may occur in these spring energy store drives, which faults adversely affect the operation of the switch and, in the context of safe operational management of the medium-voltage switchgear installation, have to be detected reliably and at an early stage in order to prevent faulty switching operations. Said faults May originate in the spring energy store drive, in the electric auxiliary drive thereof or in the combination of spring energy store drive and electric auxiliary drive.

Possible faults are:
- spring fatigue (the energy stored in the spring decreases over the course of time)
- spring reinforcement (the energy stored in the spring increases over the course of time)
- (increasing) mechanical sluggishness in the auxiliary drive including the gear mechanism,
- deterioration of the electrical characteristic values of the auxiliary drive with reduction of the mechanical power supplied
- overloading and resultant destruction of the auxiliary drive including the gear mechanism.

At present there are no methods available for reliably detecting faults and assigning them to individual components of a spring energy store drive during the operation of the medium-voltage switchgear installation. The systems used hitherto can only detect serious deviations, for example deficient functionality of the overall arrangement, and this being possible only in the context of an individual test. For this purpose, the switch has to be disconnected from the medium voltage and a specific test device has to be connected.

Against this background, there is a need for a method for operating a spring energy store drive of a medium-voltage switchgear installation which allows fault detection during operation of the medium-voltage switchgear installation as intended.

SUMMARY OF THE INVENTION

The method according to the invention for operating a spring energy store drive of a medium-voltage switchgear installation comprises at least the following steps:
- measuring a drive current of an electric auxiliary drive for tensioning a drive spring of the spring energy store drive of the medium-voltage switchgear installation;
- tensioning the drive spring by means of the electric auxiliary drive;
- creating an evaluation data set depending on the measured drive current;
- comparing the evaluation data set with an expectation; and
- outputting a maintenance signal, depending on a result of the comparing.

The method affords the advantage that the state of the spring energy store drive and its components such as spring and auxiliary drive including gear mechanism can be detected and assessed in the course of a customary switching action during operation of the medium-voltage switchgear installation as intended. The output of the maintenance signal makes it possible, in a timely manner before failure or an unacceptable probability of a malfunction of the spring energy store drive, to plan a maintenance measure and to implement it at a time that has the least possible adverse effect on operation supplied or controlled via the medium-voltage switchgear installation, and in this way to reduce outage times to the greatest possible extent.

The invention is based on, and concomitantly includes, the knowledge that the state of the spring energy store drive can be deduced from the drive current of the electric auxiliary drive used for tensioning the spring. By way of example, the drive current increases if the auxiliary drive has to apply a greater torque owing to increasing mechanical sluggishness of the gear mechanism or the motor bearings of the auxiliary drive. However, the current May also decrease if the tensioning force of the spring decreases owing to material fatigue across a large number of switching actions. If such a case is detected, the maintenance signal can indicate this, such that corresponding maintenance measures can be initiated.

In the present case, medium voltage denotes an electrical voltage in the range of 1000 volts to approximately 52 kilovolts.

Particularly preferably, a temporal profile of the drive current is measured in the step of measuring the drive current. In this case, the evaluation data set is created depending on the measured temporal profile of the drive current. On the basis of a measurement of the temporal profile of the drive current, a plurality of parameters can be determined and, for example, mutually opposing effects which cancel one another out in an individual measurement and which each on their own signify a deterioration of the spring energy store drive can be distinguished from one another and recognized. As a result, the measurement of the temporal profile of the drive current leads to a higher probability that a deterioration of the spring energy store drive can be detected in a timely manner and the affected component of the spring energy store drive can already be identified before the maintenance measure to be initiated, such that a better assessment of the urgency of the implementation of the maintenance measure becomes possible.

By way of example, the temporal profile can be measured on the basis of a periodic measurement of the instantaneous current of the electric auxiliary drive. It is likewise possible, at specific times, to perform individual measurements relating to points of the real profile which are of particular interest when creating the evaluation data set. In this case, fewer measurement data to be processed arise overall, which simplifies the evaluation and storage. Since these points or at least some of these points may shift over time owing to the deterioration to be observed, provision can also be made for performing a series of individual measurements around these points and not measuring the drive current, or measuring it less frequently, between these series.

Preferably, an integral of the temporal profile of drive current is determined in the step of creating the evaluation data set. The integral of the drive current indicates how much electrical energy was applied for the complete tensioning process. An increase in this variable is a highly suitable indicator of a deterioration of the spring energy store drive.

In this case, a first portion of the integral can be determined, which indicates a tensioning work performed by the auxiliary drive. This first portion of the integral can relate in particular to the temporal section of the measured temporal profile which extends from a local minimum after the activation of the auxiliary drive until the deactivation thereof. The first portion of the integral offers information about whether and how the elasticity of the spring has changed over time, which, in the case of slackening of the spring, for example, may be manifested in an undesirably reduced movement speed at which the moving contact of the switch is moved during the switching action.

Moreover, a second portion of the integral can be determined, which indicates drive losses of the auxiliary drive. This second portion of the integral can relate in particular to a temporal section of the measured temporal profile which extends from the point in time of the activation of the auxiliary drive until the local minimum mentioned above, and also to a pedestal region of the temporal profile, which is limited upwardly by the current intensity at said local minimum. The second portion of the integral offers information about whether motor bearings, gear mechanisms and other conversion facilities and transmission facilities for the motor force of the auxiliary drive through to the spring have become more sluggish or have deteriorated or changed in some other way.

In a combination of the last two embodiments mentioned of the method according to the invention, the first and second portions of the integral can be expressed as a relationship with respect to one another. This enables a plurality of fault variants to be deduced from a single relationship value, which can simplify the step of comparing with the expectation.

Preferably, at least one characteristic point in time is determined when creating the evaluation data set. In this case, in the step of comparing the evaluation data set, the at least one characteristic point in time and/or a drive current measured at the at least one characteristic point in time are/is compared with an expectation value assigned to the at least one characteristic point in time. The characteristic points in time are determined for example relative to a point in time at which the activation of the auxiliary motor is started, and denote times at which a known behavior expected for a given type of spring energy store drive can be recognized. By way of example, the at least one characteristic point in time can be a point in time selected from:

the beginning of a current flow through the auxiliary drive, the beginning of the tensioning of the drive spring, the occurrence of a local or global maximum of the drive current, the switch-off point in time of the auxiliary drive, and the end of a current flow through the auxiliary drive.

The expectation with which the evaluation data set is compared can be in particular a historical data set or a predefined data set specific to a type of spring energy store drive. A historical data set can contain for example a data set of the spring energy store drive recorded in the context of the production of the same spring energy store drive during trial tensioning of the spring in accordance with the method steps of the method according to the invention in this regard, or an evaluation data set recorded in the course of an earlier implementation of the method according to the invention. A specific data set predefined for the type of spring energy store drive can describe a behavior of the spring energy store drive that is generalized across production variations, as a result of which the described measuring in the context of the production of the spring energy store drive can be obviated in a time- and cost-saving manner.

A second aspect of the invention relates to a spring energy store drive for a medium-voltage switchgear installation, comprising an electric auxiliary drive configured to tension a drive spring of the spring energy store drive, and comprising a measuring unit configured to measure a drive current of the auxiliary drive. In this case, the measuring unit is additionally configured to communicate to a control unit a measurement result for carrying out the method of the first aspect of the invention. The control unit can be realized together with the measuring unit as a common unit or can alternatively be realized as a separate unit outside the spring energy store drive, for example in a digital protection device of the medium-voltage switchgear installation or a remote control center.

A further aspect of the invention introduces a medium-voltage switchgear installation comprising a switch having a moving contact, and comprising a spring energy store drive in accordance with the preceding aspect of the invention, which is configured to move the moving contact of the switch in response to a control signal.

Finally, the invention relates to a data storage device comprising a computer program which, when executed by a control unit for example a control unit of a spring energy store drive, of a medium-voltage switchgear installation, of a digital protection device or of a remote control center, carries out the method according to the invention.

BRIEF DESCRIPTION OF THE DRAWINGS

The invention is explained in greater detail below with reference to drawings of exemplary embodiments. In the figures.

DETAILED DESCRIPTION OF THE FIGURES

Figure 1:
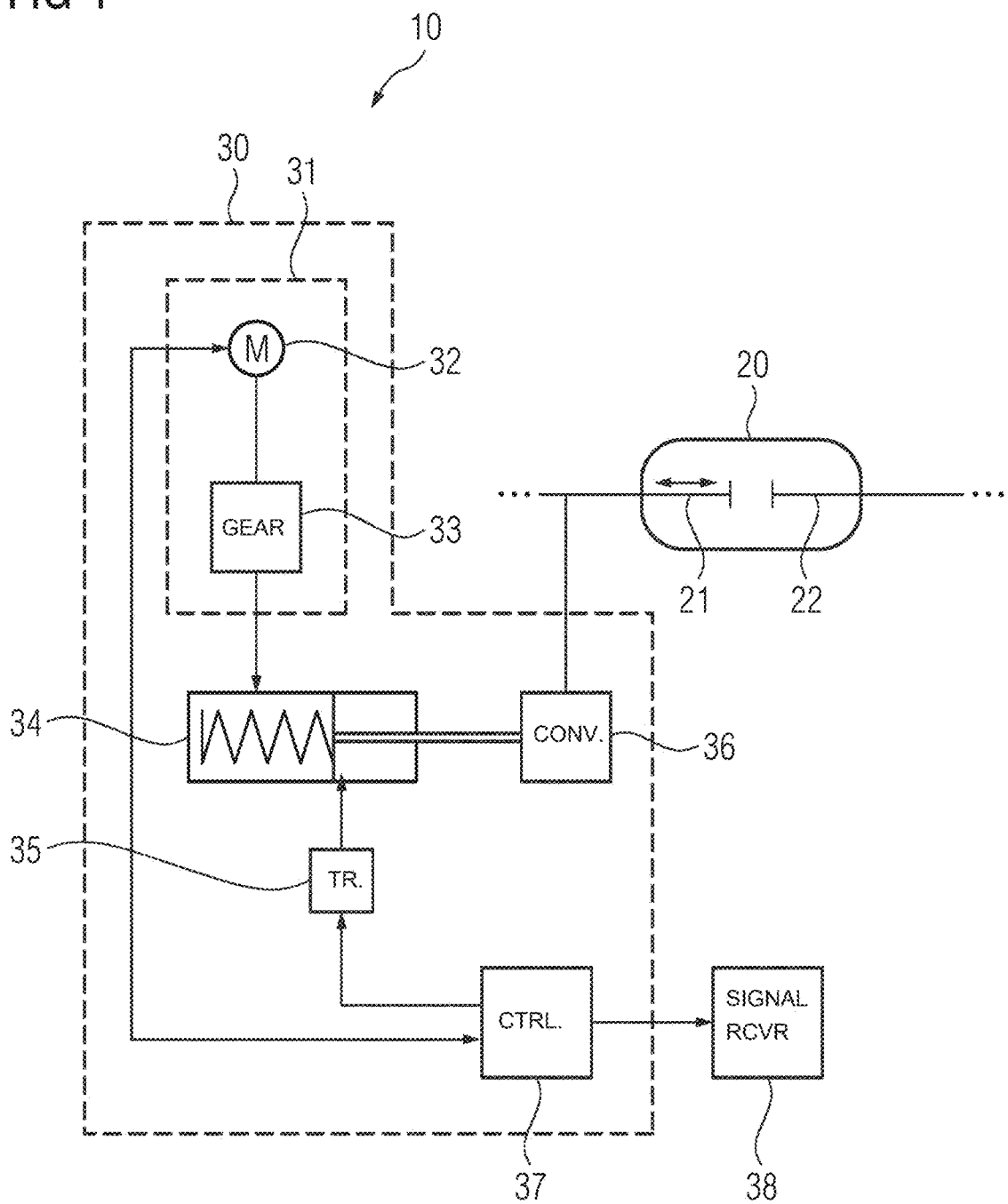
FIG. 1 shows one exemplary embodiment of a medium-voltage switchgear installation with a spring energy store drive according to the invention.

FIG. 1 shows one exemplary embodiment of a medium-voltage switchgear installation 10 with a spring energy store drive 30 according to the invention. The spring energy store drive 30 is connected to a moving contact 21 of a switch 20 of the medium-voltage switchgear installation 10 and is configured to move the moving contact 21 for the implementation of a switching action rapidly and with the least possible delay (in particular to move it away from a mating contact 22 in the course of the opening of the switch 20).

For this purpose, the spring energy store drive 30 has a drive spring 34, which in the tensioned state keeps the energy required for the desired rapid movement of the moving contact 21 as spring energy, in order to release said energy, in a manner triggered by a trigger 35, rapidly in the case of use. In the exemplary embodiment shown, the drive spring 34 is connected to the moving contact 21 indirectly via a conversion facility 36, which can comprise for example a lever arm or the like mounted on a shaft, but embodiments are also conceivable in which the drive spring 34 is directly connected to the moving contact 21.

The spring energy store drive 30 can contain further drive springs for the opening or closing, optionally in parallel for a plurality of switching actions in a time period that is shorter than the duration of renewed tensioning of a respective triggered drive spring.

The spring energy store drive 30 additionally has an electric auxiliary drive 31 provided for renewed tensioning of the drive spring 34 after the triggering thereof. In the exemplary embodiment shown here, the electric auxiliary drive 31 comprises an electrical motor 32, which is connected or connectable to the drive spring 34 via a gear mechanism 33.

The connection of drive spring 34 and electric auxiliary drive 31 can be realized in diverse ways in a manner known in the technical field. By way of example, the gear mechanism 33 can be connected to a lever that is pivoted by the gear mechanism and has a spring eye, into which the drive spring is suspended. As a result of the pivoting of the lever, the drive spring is tensioned (or compressed, which is combined under one designation "tensioning" in the context of the invention) and thus subjected to spring energy.

The spring energy store drive of the exemplary embodiment in FIG. 1 furthermore has a measuring and/or control unit 37 configured to control the trigger 35 for triggering the drive spring 34 and subsequently to activate the electric auxiliary drive 31 or the electric motor 32 in order to tension the drive spring 34 again. The trigger 35 can comprise a mechanical blockade of the gear mechanism 33, for example, which is released by the trigger, such that a freewheel of the gear mechanism is activated and the drive spring is released.

The measuring and/or control unit 37 is illustrated in FIG. 1 as a single unit that is part of the spring energy store drive 30, but can also be realized as a distributed arrangement comprising, for example, a measuring unit and a control unit arranged at a distance therefrom. In such a case, the measuring unit can be arranged in the spring energy store drive and the control unit can be arranged in a digital protection device in the medium-voltage switchgear installation or a remote location such as a control center. The illustrated functions of the control unit can also be divided among a plurality of units. By way of example, the control of the trigger 35 can be effected by a unit arranged in the spring energy store drive 30, whereas the evaluation of the measured values as described below can be effected in a different, in particular remote, unit.

The measuring and/or control unit 37 is configured to measure a drive current of an electric auxiliary drive 31 during the tensioning of the drive spring 34 and to deduce a state of the spring energy store drive 30 and/or of specific components of the spring energy store drive 30 on the basis of the measured drive current. A result of this assessment can be output as a maintenance signal to a signal receiver 38, which can be for example a display of the medium-voltage switchgear installation 10 or else a remote control center, in order to indicate the degree of the necessity for a maintenance measure and optionally that component of the spring energy store drive 30 which requires maintenance.

Figure 2:
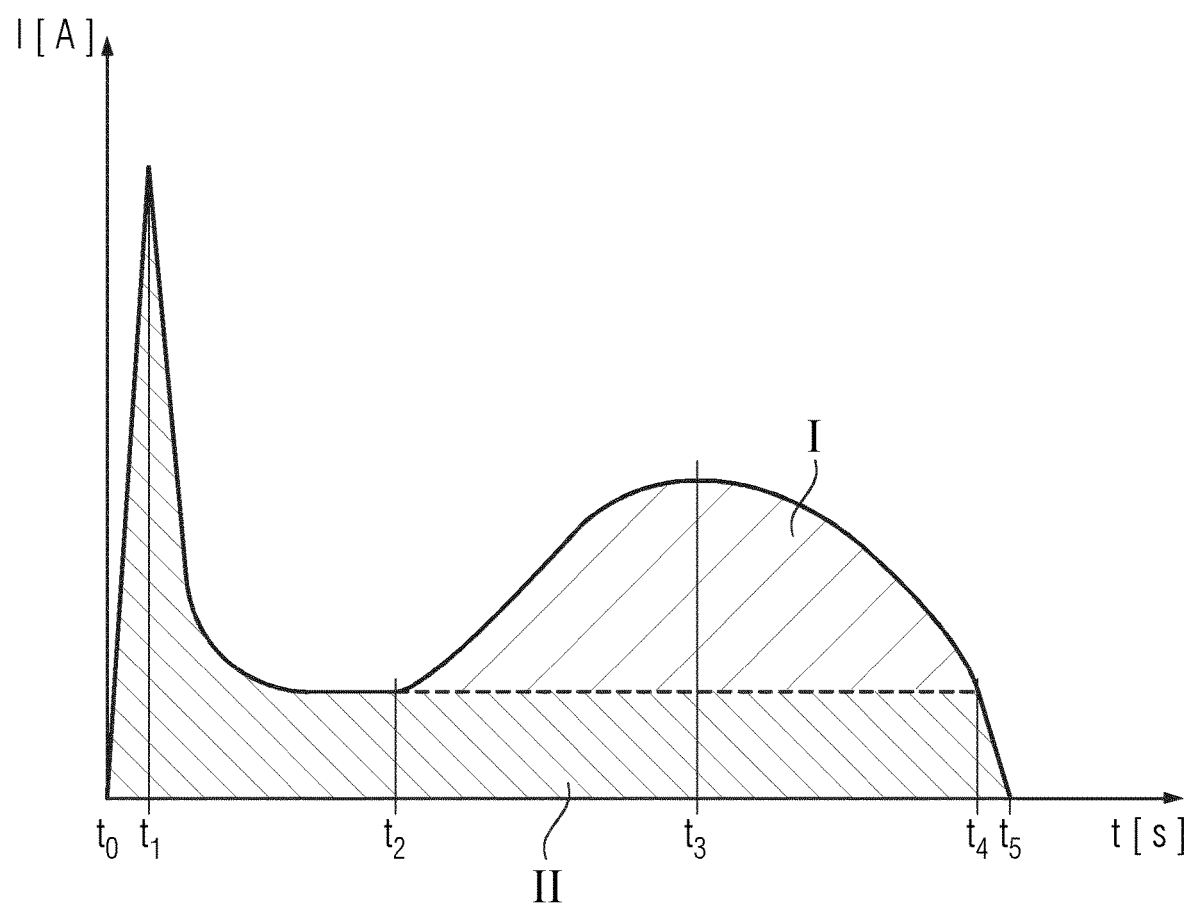
FIG. 2 shows one example of a temporal profile of a drive current of an electric auxiliary drive of the spring energy store drive according to the invention.

FIG. 2 shows one example of a temporal profile of a drive current I of an electric auxiliary drive 31 of the spring energy store drive 30 such as can be measured for example by the measuring and/or control unit 37 of the exemplary embodiment shown in FIG. 1. The typical temporal profile of the drive current illustrated extends over a time period of less than 10 seconds, for example 3 to 5 seconds, in customary applications. The electric auxiliary drive is activated at a point in time $t_0$, whereupon until a point in time $t_1$ a very high drive current is established, in a manner limited in the rate of rise by the inductance of the motor windings of the electric motor 32. The rapidly rising drive current builds up a magnetic field in the motor windings, which magnetic field causes the motor movement. The electric motor 32 begins to rotate at the point in time $t_1$, as a result of which a generator effect of the rotation generates a back-EMF counteracting the cause, for which reason the drive current decreases again upon the beginning of the rotation of the electric motor 32 at the point in time $t_1$. After the electric motor 32 has started up, the drive current decreases and then remains at a plateau until a point in time $t_2$, which plateau characterizes the electric motor 32 still running without a mechanical load, i.e. before the beginning of the tensioning work. The current expended in this time period is required in order to overcome losses in the electric motor 32, the gear mechanism 32 and the other movable components connected to the electric motor 32. Accordingly, drive current measurement values measured during the plateau contain information about the state of the components mentioned.

Starting from the point in time $t_2$, the drive current rises again to reach a (local) maximum at a point in time $t_3$. The rise of the drive current is caused by the additional torque required for tensioning the drive spring 34. The actual tensioning of the drive spring 34 thus begins at the point in time $t_2$, that is to say that spring energy is introduced into the drive spring 34 by the electric auxiliary drive 31 starting from this point in time. The drive spring 34 is tensioned further until the electric auxiliary drive 31 is deactivated at a point in time $t_4$. This point in time can be determined in particular by the position of the drive spring 34 or of a component mechanically connected to the drive spring 34, such as, for example, also the electric motor 32 itself. By way of example, an auxiliary switch can be actuated indirectly or directly by the drive spring 34 when the latter has reached an envisaged end position, as a result of which the drive electric circuit of the electric auxiliary drive is interrupted by the auxiliary switch. However, it is also conceivable to fixedly choose the point in time $t_4$ for a given spring energy store drive and, for operation of the medium-voltage switchgear installation, to assume that the drive spring 34 has been tensioned far enough at this point in time.

After the deactivation of the electric auxiliary drive at the point in time $t_4$, the drive current falls rapidly until it becomes zero at a point in time $t_5$. Current that flows during this time can flow, for example, in a manner maintained by the inductance of the motor windings, in an arc in the abovementioned auxiliary switch until the motor windings are demagnetized.

The control unit 37 can measure the drive current of the electric auxiliary drive 31 in various ways. By way of example, in particularly simple exemplary embodiments, it is possible to measure the drive current only once at a predetermined point in time after the activation of the electric auxiliary drive, for example at a point in time $t_3'$ corresponding to the expected point in time of the occurrence of the (local) maximum of the drive current (point in time $t_3$ in FIG. 2). If the value of the drive current measured at this point in time deviates from an expectation, this may indicate for example the drive spring becoming fatigued (less drive current is required to tension the drive spring), the friction losses in the electric motor and/or gear mechanism rising (more drive current is required to tension the drive spring), increasing mechanical play in the electric auxiliary motor (the local maximum is not reached until later) and other aging effects as well. Since some of these effects are mutually opposing, they may mask one another if they occur simultaneously, and so repeated measurements are advantageous.

The measurements can be repeated periodically, for example, for instance at least every 50 milliseconds. In practical exemplary embodiments, the drive current is measured at intervals of 1 millisecond or less, for example with a sampling frequency of 8 kilohertz.

As an alternative to the single or periodic measurement, however, it is also possible to carry out a plurality of measurements of the drive current that are not distributed uniformly over time, namely at the expected times of the occurrence of the or a few of the characteristic points in time described as $t_1$ to $t_5$. By way of example, it is possible to effect measurement at a point in time $t_2'$ lying with high probability between the times $t_1$ and $t_2$ in FIG. 2, in order to obtain a measured value that is characteristic of the load-free operation of the electric auxiliary drive 31. Afterward, it is possible to effect measurement again at the point in time $t_3'$ lying between the times $t_2$ and $t_4$ in FIG. 2, in order to obtain a measured value from which a measure of the tensioning work applied by the electric auxiliary drive 31 can be acquired. Such a method is simple to carry out, but already affords a more reliable detection of various aging effects by comparison with a single measurement of the drive current.

It is also possible to carry out a series of measurements within a time period around the expected times of the occurrence of the characteristic points in time to be taken into account for a specific embodiment of the operating method according to the invention, and then to interrupt the measurements until approaching the next (expected) characteristic point in time. Within each series of measurements, it is then possible to consider the respective maximum or minimum with the associated measurement point in time as an actual characteristic point in time and to use it for the evaluation. As a result, the number of measurements and the data to be processed for the evaluation are reduced by comparison with a continuous or periodic measurement of the drive current, but a comparable reliability of the detection of aging effects in the spring energy store drive is nevertheless achieved.

In FIG. 2, the area below the temporal profile of the drive current corresponds to the integral of the drive current, which in turn denotes the total energy expended for tensioning the drive spring. Said integral can be subdivided into two parts, indicated by different hatchings in FIG. 2, of which the part I (first part of the integral of the drive current) indicates the spring energy actually introduced into the drive spring and the part II (second part of the integral of the drive current) indicates the losses in electric motor 32, gear mechanism 33, etc. The part I is distinguished from the rest by virtue of the fact that, from the point in time $t_2$ on, only the portions of the drive current that lie above the instantaneous value of the drive current at the point in time $t_2$ are taken into account for the part I until the current falls below said instantaneous value again or until the electric auxiliary drive is deactivated.

The integral and/or the parts of the integral can be considered for the evaluation. Moreover, it is possible to express the integral or its parts as a relationship with one another and to take account of these relationships in the evaluation.

Independently of the details of the evaluation of an exemplary embodiment of the method according to the invention, in this case an evaluation data set that describes the present state of the spring energy store drive as meaningfully as possible is created and subsequently compared with an expectation, for example an older evaluation data set, a corresponding data set obtained in the course of an initial measurement in the context of the production of the spring energy store drive, or a data set typical of the type of construction of the spring energy store drive. A maintenance signal can then be output depending on a result of the comparison. By way of example, the necessity for a maintenance measure may be indicated if the evaluation data set or individual data of the evaluation data set deviate(s) from the expectation by more than a predetermined fault tolerance. Depending on the embodiment variant of the method, the type of probable fault and/or the affected component can also be signaled by the maintenance signal.

Figure 3:
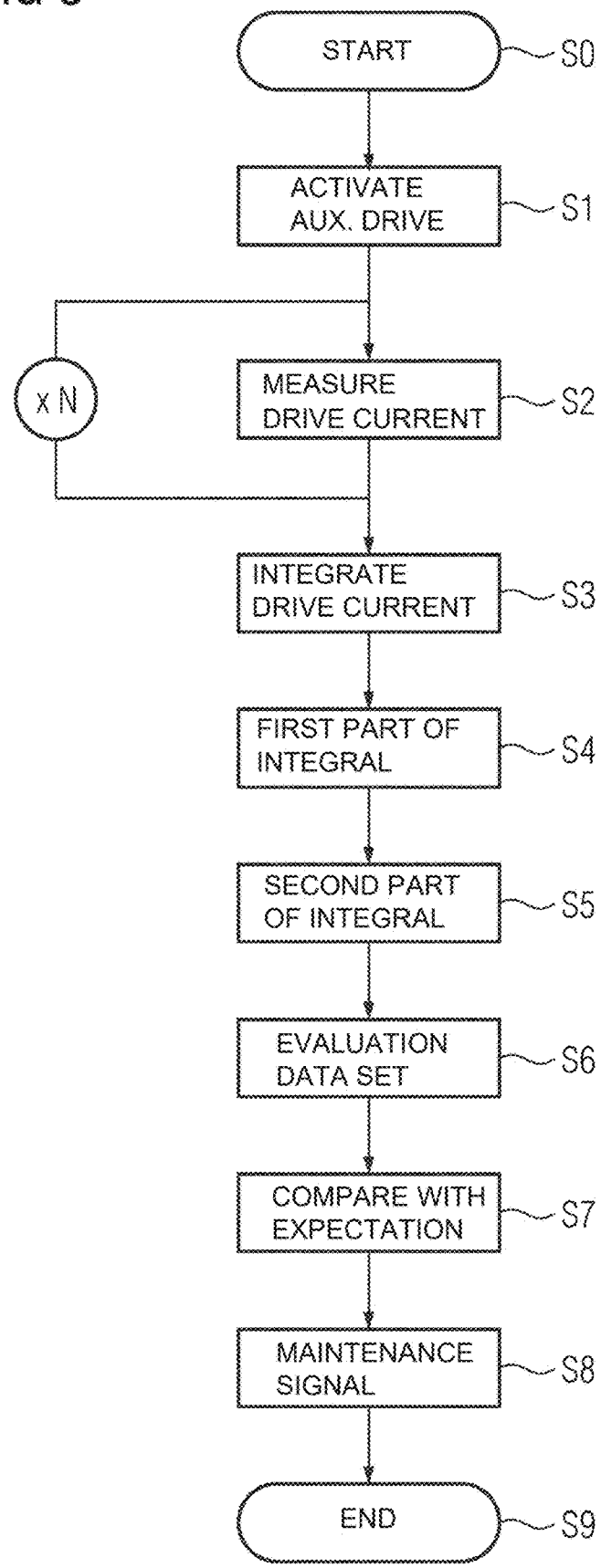
FIG. 3 shows one exemplary embodiment of a method according to the invention for operating the spring energy store drive.

FIG. 3 shows one exemplary embodiment of a method according to the invention for operating the spring energy store drive. The method begins in a start step S0 and then continues with a step S1, in which the electric auxiliary drive is activated. After the electric auxiliary drive has been activated, a step S2 is repeatedly carried out, in which the drive current of the electric auxiliary drive is measured while the drive spring of the spring energy store drive is tensioned. The temporal profile of the drive current is measured as a result.

It should be noted here that, in principle, it is not important whether the measurement of the drive current is begun simultaneously with the activation of the electric auxiliary drive or before or after that or is actually carried out continuously independently thereof. In this respect, FIG. 3 serves merely to elucidate one exemplary embodiment and to afford a better understanding of the invention.

An integral of the drive current is determined in a step S3. Instead of being carried out after the measurement of the entire temporal profile as shown in FIG. 3, this step can also be carried out in parallel with step S2 by continuous culmination of the individual measured values. Afterward, the first part of the integral as explained with regard to FIG. 2 is determined in a step S4 and the second part of the integral is determined in a step S5. It goes without saying that the order of steps S4 and S5 can be interchanged. Moreover, it is possible to determine one variable out of the integral, the first part of the integral and the second part of the integral from the other two variables by summation or difference formation. In step S6, an evaluation data set is created, which can contain an arbitrary combination of the measured values, the integral, the parts thereof and/or the relationship(s) thereof, or else just a single one of the variables mentioned. In step S7, this evaluation data set is compared with an expectation and, finally, in a step S8, a maintenance signal is output depending on a result of the comparison before the method is ended in an end step S9 until the next tensioning of the drive spring. In response to the maintenance signal, a suitable maintenance measure can be planned and the medium-voltage switchgear installation can be temporarily deactivated at an expected point in time for the implementation of the maintenance measure.

The invention has been explained in greater detail with reference to drawings of exemplary embodiments. The exemplary embodiments are not intended to restrict the scope of protection of the invention, which is defined solely by the claims that follows; rather, the exemplary embodiments merely serve to afford a better understanding.

LIST OF REFERENCE SIGNS

10 Medium-voltage switchgear installation
20 Switch
21 Moving contact
22 Mating contact
30 Spring energy store drive
31 Electric auxiliary drive
32 Electric motor
33 Gear mechanism
34 Drive spring
35 Trigger
36 Conversion facility
37 Measuring unit, control unit
38 Signal receiver

The invention claimed is:

1. A method for operating a spring loaded drive of a medium-voltage switchgear installation, the method comprising the following steps:
tensioning a drive spring of the spring loaded drive of the medium-voltage switchgear installation by an electric auxiliary drive and measuring a drive current of the electric auxiliary drive for tensioning the drive spring;
creating an evaluation data set depending on the measured drive current;
comparing the evaluation data set with expected data to form a comparison result; and
when the evaluation data set deviates from the expected data by more than a given tolerance, outputting a maintenance signal.

2. The method according to claim 1, wherein the step of measuring the drive current comprises measuring a temporal profile of the drive current and creating the evaluation data set depending on the measured temporal profile of the drive current.

3. The method according to claim 2, wherein the step of creating the evaluation data set comprises determining an integral of the temporal profile of the drive current.

4. The method according to claim 3, which comprises determining a first portion of the integral which indicates a tensioning work performed by the auxiliary drive.

5. The method according to claim 4, which comprises determining a second portion of the integral which indicates drive losses of the auxiliary drive.

6. The method according to claim 5, which comprises expressing the first portion and the second portion of the integral as a relationship with respect to one another.

7. The method according to claim 1, wherein the step of creating the evaluation data set comprises determining at least one characteristic point in time and the step of comparing the evaluation data set comprises comparing at least one of the at least one characteristic point in time or a drive current measured at the at least one characteristic point in time with an expectation value assigned to the at least one characteristic point in time.

8. The method according to claim 7, wherein the at least one characteristic point in time is a point in time selected from the group consisting of a start of a current flow through the auxiliary drive, a start of a tensioning of the drive spring, an occurrence of a local or global maximum of the drive current, a switch-off point in time of the auxiliary drive, and an end of a current flow through the auxiliary drive.

9. The method according to claim 1, wherein the expected data is a historical data set or a predefined data set specific to a type of the spring loaded drive.

10. A non-transitory data storage device, comprising a computer program which, when executed by a control unit, carries out the method according to claim 1.

11. The non-transitory data storage device according to claim 10, wherein the control unit is a control unit of a spring energy store drive, of a medium-voltage switchgear installation, of a digital protection device, or of a remote control center.

12. A spring loaded drive for a medium-voltage switchgear installation, comprising:
a drive spring;
an electric auxiliary drive configured to tension said drive spring;
a measuring unit configured to measure a drive current of said auxiliary drive and to communicate a measurement result to a control unit configured to operate the spring loaded drive by:
tensioning a drive spring of the spring loaded drive by the electric auxiliary drive and measuring the drive current of said electric auxiliary drive;
creating an evaluation data set depending on the measured drive current;
comparing the evaluation data set with expected data; and
when the evaluation data set deviates from the expected data by more than a given tolerance, outputting a maintenance signal.

13. A medium-voltage switchgear installation, comprising:
a switch with a movable contact;
a spring loaded drive having a drive spring and an electric auxiliary drive for tensioning said drive spring; and
a measuring unit for measuring a drive current of said auxiliary drive and for communicating a measurement result to a control unit; and
wherein said control unit is configured to operate the spring loaded drive by:
tensioning a drive spring of the spring loaded drive by the electric auxiliary drive;
measuring a drive current of said electric auxiliary drive for tensioning the drive spring;
creating an evaluation data set depending on the measured drive current;
comparing the evaluation data set with expected data and, when the evaluation data set deviates from the expected data by more than a given tolerance, outputting a maintenance signal; and
outputting a control signal to move said movable contact of said switch.

* * * * *